(12) United States Patent
Bydder

(10) Patent No.: US 7,795,869 B1
(45) Date of Patent: Sep. 14, 2010

(54) PROCESSING OF MULTIPLE ECHO DATA SETS IN MAGNETIC RESONANCE IMAGING

(75) Inventor: Mark Bydder, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 1170 days.

(21) Appl. No.: 11/416,797

(22) Filed: May 2, 2006

Related U.S. Application Data

(60) Provisional application No. 60/677,135, filed on May 2, 2005.

(51) Int. Cl.
G01V 3/00 (2006.01)
(52) U.S. Cl. ....................... 324/309; 324/307
(58) Field of Classification Search ............... 324/309, 324/307
See application file for complete search history.

(56) References Cited

U.S. PATENT DOCUMENTS 5,270,651 A * 12/1993 Wehrli ..................... 324/308
6,005,390 A * 12/1999 Watanabe et al. .......... 324/307

OTHER PUBLICATIONS

Andersen, A.H., "On the Rician Distribution of Noisy MRI Data," Magnetic Resonance in Medicine, 36: 331-333 (1996).
Brosnan et al., "Noise Reduction in Magnetic Resonance Imaging," Magnetic Resonance in Medicine, 8: 394-409 (1988).
Bydder et al., "Combination of signals from array coils using image-based estimation of coil sensitivity profiles," Magnetic Resonance in Medicine, 47:539-548 (2002).
De Moor, B. "The Singular Value Decomposition and Long and Short Spaces of Noisy Matrices," IEEE Transactions on Signal Processing, 41(9): 2826-2838 (1993).
Glover, G.H., "Multipoint Dixon Sequences for Water and Fat Proton and Susceptibility Imaging," Journal of Magnetic Resonance Imaging 1: 521-530 (1991).
Greve et al., "Weighting of Multiple Gradient Echo Images to Improve Detection of fMRI Activation," 9th International Conference on Functional Mapping of the Human Brain, New York, New York, Jun. 19-22, 2003, New Proceedings of the Human Brain Mapping Conference, poster No. 842, p. e1626-e1628, (2003).
Hyvarinen et al., "Principal Component Analysis and Whitening," Chapter 6 in *Independent Component Analysis*. New York: John Wiley & Sons, pp. 125-144 (2001).
Jensen et al, "Reduction of Broad-Band Noise in Speech by Truncated QSVD," IEEE Transations on Speech and Audio Processing, 3(6): 439-448, (1995).

(Continued)

*Primary Examiner*—Louis M Arana
(74) *Attorney, Agent, or Firm*—Perkins Coie LLP

(57) ABSTRACT

Techniques for magnetic resonance imaging (MRI) including obtaining a plurality of MRI images acquired at different echo times subsequent to an excitation pulse applied to a sample which is being imaged, performing a curve-fitting for a specified variation in each pixel of the MRI images, and using fitted parameters for the specified variation in the MRI images to synthesize the MRI images to form an image at any echo time with reduced noise. Performing singular value decomposition to determine the types of variation in each pixel of the MRI images and using only the most significant variations to synthesize the MRI images to form an image with reduced noise.

22 Claims, 17 Drawing Sheets

OTHER PUBLICATIONS

Kung et al., "State-space and singular-value decomposition-based approximation methods for the harmonic retrieval problem," J Opt Soc Am 73: 1799-1811 (1983).

Lu, D. and P.M. Joseph, "A matched filter echo summation technique for MRI," Magnetic Resonance Imaging, 13: 241-249, (1995).

Noll et al., "A Homogeneity Correction Method for Magnetic Resonance Imaging with Time-Varying Gradients," IEEE Transaction on Medical Imaging, 10(4): 629-637, (1991).

Pijnappel et al. "SVD-based Quantification of Magnetic-Resonance Signals," Journal of Magnetic Resonance, 97: 122-134, (1992).

Press, W.H. et al., *Numerical Recipes in C, The Art of Scientific Computing, Second Edition*, New York: Cambridge University Press, pp. 59-70 (1992).

Pruessmann et al., "SENSE: Sensitivity Encoding for Fast MRI," Magnetic Resonance in Medicine, 42: 952-962, (1999).

Reeder et al, "Multicoil Dixon Chemical Species Separation With an Iterative Least-Squares Estimation Method," Magnetic Resonance in Medicine, 51: 35-45, (2004).

Robson et al., "Magnetic Resonance: An Introduction to Ultrashort TE (UTE) Imaging," Journal of Computer Assisted Tomography, 27: 825-846, (2003).

Roemer et al., "The NMR phased array," Magnetic Resonance in Medicine, 16: 192-225, (1990).

Van Huffel, S., "Enhanced resolution based on minimum variance estimation and exponential data modeling," Signal Processing, 33: 333-355, (1993).

Walsh et al., "Adaptive reconstruction of phased array MR imagery," Magneic Resonance in Medicine, 43: 682-690 (2000).

\* cited by examiner

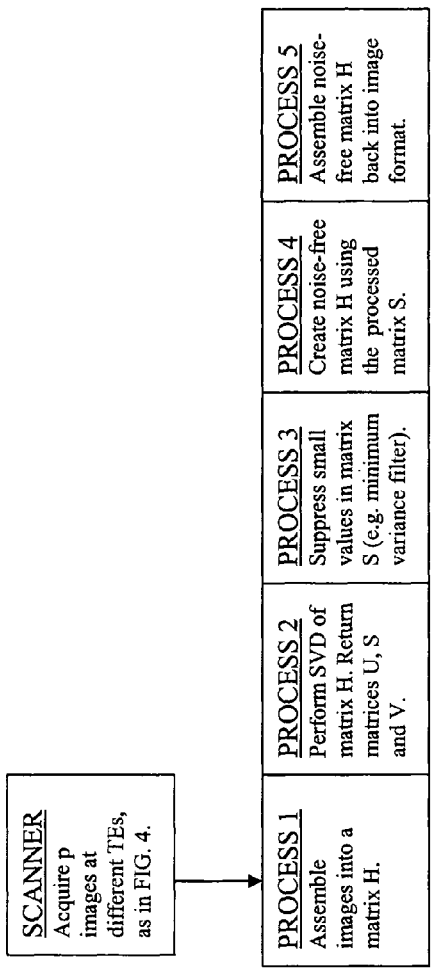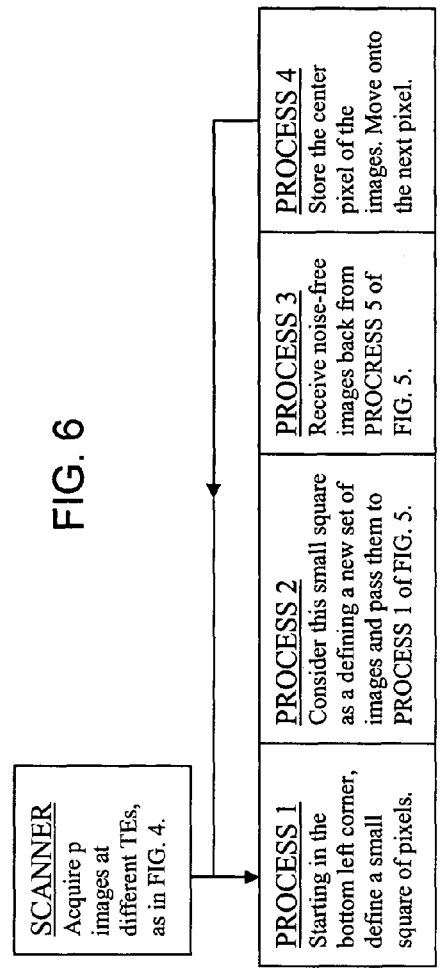

Plot of Singular Values
The matrix size was 288×384 and 9 echos were used. The singular values are: 1.40, 0.19, 0.15, 0.10, 0.08, 0.07, 0.07, 0.06, 0.06 (to two significant figures), which suggests $\sigma_{noise} \approx 0.06$ and noise variance of $3.3 \times 10^{-8}$. For comparison, the variance estimated from the background noise is $3.6 \times 10^{-8}$.

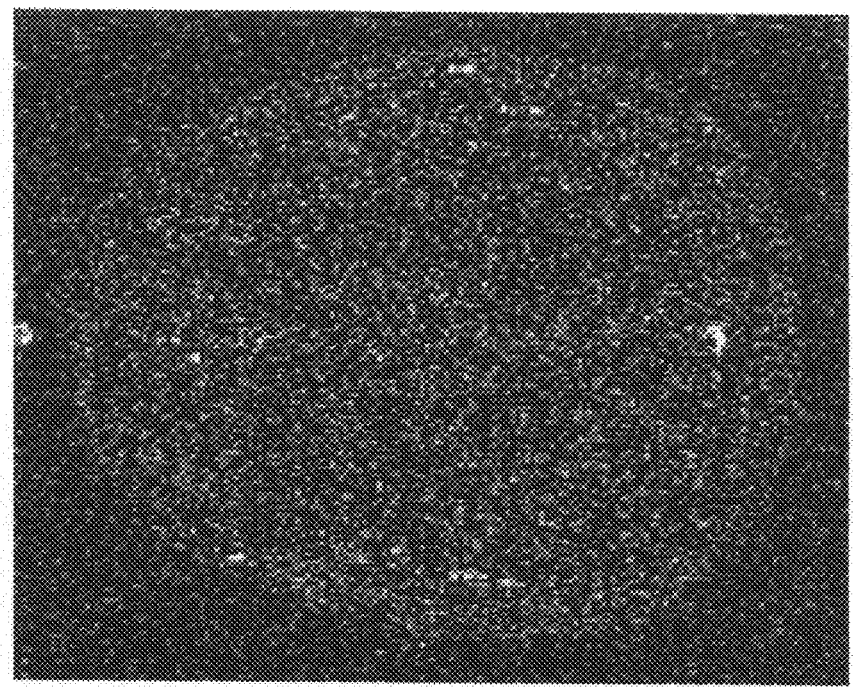
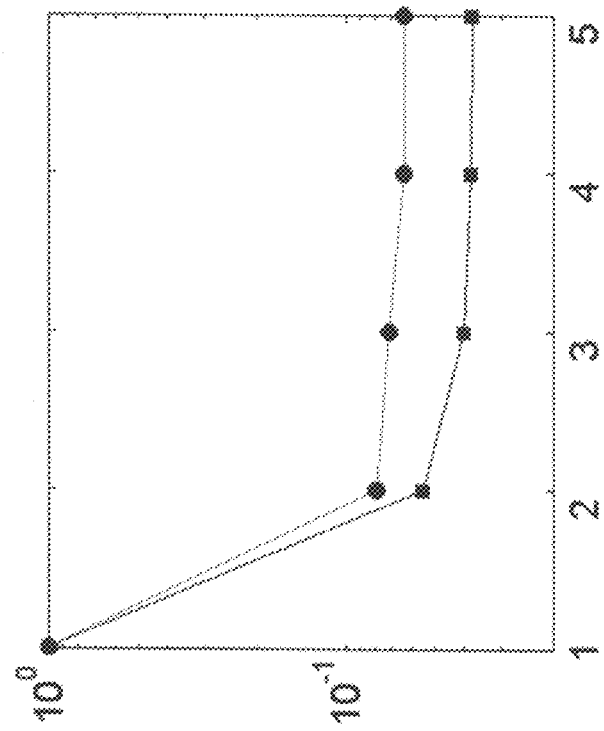

US 7,795,869 B1

PROCESSING OF MULTIPLE ECHO DATA SETS IN MAGNETIC RESONANCE IMAGING

RELATED PATENT APPLICATION

This application claims the benefit of U.S. Provisional Application No. 60/677,135 entitled "PROCESSING OF MULTIPLE ECHO DATA SETS IN MAGNETIC RESONANCE IMAGING" and filed May 2, 2005, which is incorporated by reference in its entirety as part of the specification of this application.

BACKGROUND

This application relates to magnetic resonance imaging.

Magnetic resonance imaging (MRI) uses magnetic resonances to acquire images in a wide range of imaging applications in medical, biological and other fields, including imaging various materials and body parts of a person or an animal. In essence, a typical MRI technique produces an image of a selected part of an object under examination by manipulating magnetic spins in the selected part and processing measured responses from the magnetic spins. An MRI system may include hardware to generate different magnetic fields for imaging, including a static magnetic field along a z-direction to polarize the magnetic spins, gradient fields along mutually orthogonal x, y, or z directions to spatially select a body part for imaging, and an RF magnetic field to manipulate the magnetic spins.

MRI detection is limited by the noise, which is usually characterized by the signal to noise ratio (SNR). In various MRI applications, it can be time consuming to acquire sufficient data to achieve a desired image quality (e.g., the image resolution and contrast). Considerable effort has been devoted to increasing the SNR in MRI and decreasing the scan time. However, trade-offs must be made between the SNR, the scan time, and also image quality.

SUMMARY

This application describes, among others, techniques for magnetic resonance imaging (MRI) including obtaining a plurality of MRI images acquired at different echo times subsequent to an excitation pulse applied to a sample which is being imaged, performing a curve-fitting for a specified variation in each pixel of the MRI images, and using fitted parameters for the specified variation in the MRI images to synthesize the MRI images to form an image at any echo time with reduced noise. In one example, an MRI method is described to combine images acquired at multiple echo times in a way that optimally estimates the noise-free images. The result is an increase in SNR with minimal degradation of spatial resolution and contrast. The curve-fitting for the specified variation in each pixel of the MRI images may be achieved via various techniques, including using a predetermined temporal evolution of the signal such as an exponential decay with the echo time, a Fourier transform or a wavelet transform.

In another example, a method is described for de-noising multiple echo data sets using singular value decomposition (SVD). Images are acquired using a multiple gradient or spin echo sequence and the variation of the signal with echo time (TE) in all pixels is subjected to SVD analysis to determine the components of the signal variation. The least significant components are associated with small singular values and tend to characterize the noise variation. Applying a "minimum variance" filter to the singular values suppresses the noise components in a way that optimally approximates the underlying noise-free images. The result is a reduction in noise in the individual TE images with minimal degradation of the spatial resolution and contrast. Phantom and in vivo results are presented These and other implementations, examples and variations are now described in greater detail in the drawings, the detailed description and the claims.

BRIEF DESCRIPTION OF DRAWINGS

FIG. 5 shows a block diagram of one exemplary process for performing SVD processing and combining images from different echo times.

FIG. 6 shows a block diagram of one exemplary process for performing SVD processing and combining images from different echo times using adaptive filtering.

FIG. 11C. Plot of singular values for magnitude (square) and complex (circle) data. There appear to be only two significant singular values in both cases.

FIG. 11D. The absolute difference between the images in FIGS. 11A and 11B where the window and level scaling are 10 times of that of the other images.

DETAILED DESCRIPTION

This application describes, among others, techniques for reducing noise ("de-noising") by processing multi-echo data sets using a suitable curve fitting processing technique to express the temporal evolution of the signal. Among others described in this application are variations due to exponential decay and variations characterized by a singular value decomposition analysis. The data sets acquired can include a collection of images acquired at different echo times (TEs) following the excitation pulse. Often the images with different TEs differ from one other in a known way. For example, the amount of the signal decreases exponentially as the TE becomes longer. In one implementation, the method performs data-fitting of the signals from each image to an equation for an exponential decay over the echo time. Since only two parameters are required to characterize the exponential decrease, when the number of the images (n) is greater than two, the data-fitting process can be used to provide increasingly accurate estimates of the parameters as n is increased. The parameter estimates are used to synthesize images at any specified TE. The synthesized images have the benefit of being able to construct an image at any TE and have greater signal to noise than the original images.

Figure 1:
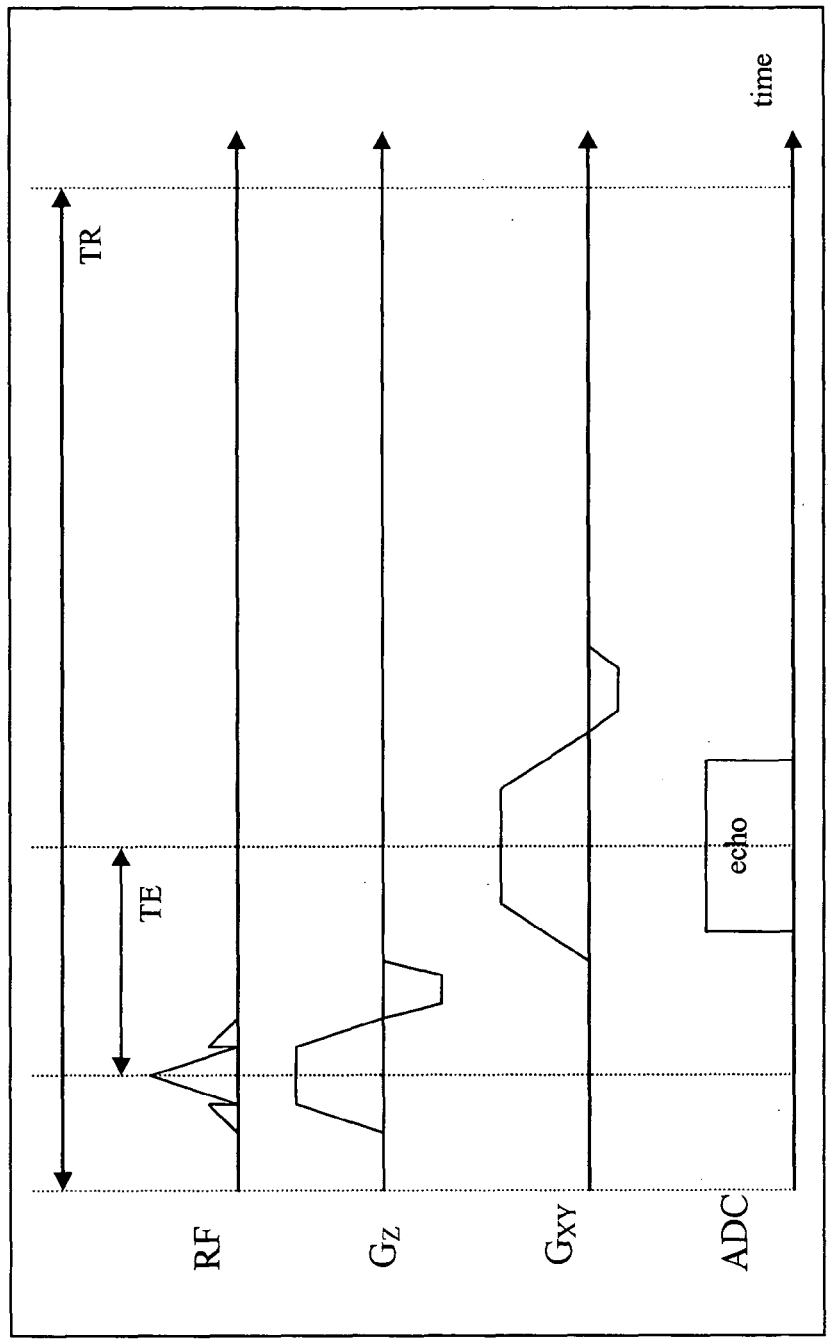
FIG. 1 shows an example of an MRI pulse diagram for a commonly used gradient echo sequence.

FIG. 1 shows an example of a pulse diagram for a commonly used MRI gradient echo sequence, where RF represents the Radio Frequency pulse (excitation), $G_Z$ represents Z-gradient (slice select), $G_{XY}$ represents XY-gradients (readout), and ADC represents the Analog to Digital Converter for data collection. As used throughout this application, TE represents the echo time and TR represents the repetition time. In this sequence illustrated in FIG. 1, the ADC (data collect) is performed at one TE and only one ADC is acquired per TR. To improve the signal to noise ratio by averaging, the entire TR is repeated two or more times to acquire different images for performing the averaging. This repetition of image acquisition makes the scan time two or more times longer. In various MRI applications, a long scan time is undesirable and may lead undesired effects that can degrade the imaging, e.g., movement of the patient during the scan.

In magnetic resonance imaging (MRI) trade-offs usually have to be made between the signal to noise ratio (SNR), scan time and image quality which can include the spatial resolution and contrast (i.e. temporal resolution). As a general rule the SNR is increased by acquiring more data points and this can be achieved using any of four generic acquisition strategies in MRI; these are referred to as readouts, echoes, repetition times (TR) and averages. Approximate time-scales associated with each acquisition are: $10^{-3}$ s, $10^{-2}$ s, $10^{0}$ s and $10^{2}$ s, respectively. Thus acquiring readout points is the most time efficient way to increase SNR while averaging is the least efficient.

Beyond a certain limit, however, the time spent acquiring readout points cannot be increased without sacrificing image quality and so less time-efficient data acquisition methods may be employed to gain higher SNR. The MRI readout duration, repetition times (TR) and averages have been used to increase SNR. Multiple echoes have not generally been used to improve SNR. Several ideas have been proposed for combining the data from different echo times (TE) but these can suffer from reduced spatial resolution and degraded contrast [1]-[3].

Figure 2:
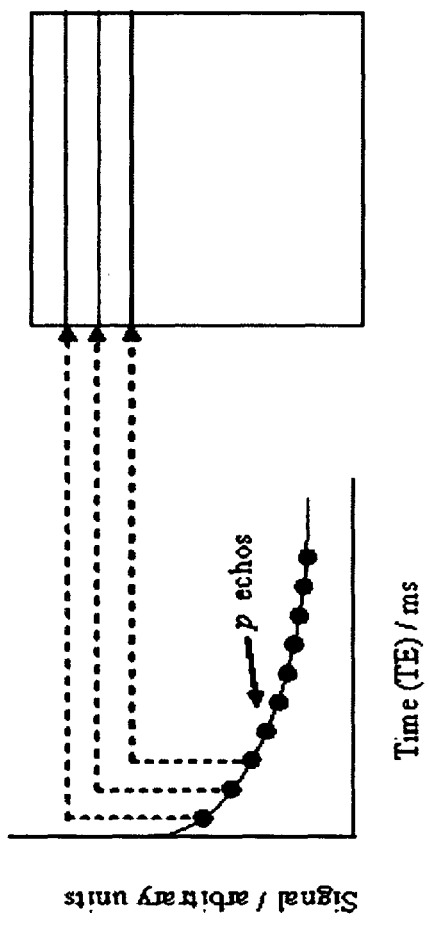
FIG. 2. Schematic diagram of one type of multiple echo acquisition (e.g. turbo spin echo, echo planar imaging). Note: each echo represents one readout line (e.g. 256 readout points).

One simple approach is to acquire p averages using a multiple echo scan containing p echoes and performing phase encoding on each echo (e.g. turbo spin echo, echo planar imaging). The scan time is the same as a single average with a single echo but the SNR is $\sqrt{p}$ higher since p averages have been made. FIG. 2 illustrates this technique. The disadvantage of this is that each image is a composite of data acquired at several time points and the signal may change significantly between each acquisition. Therefore, the image is effectively low-pass filtered, causing a loss of spatial resolution. The different contrasts from short and long TEs also tend to be mixed.

Figure 3:
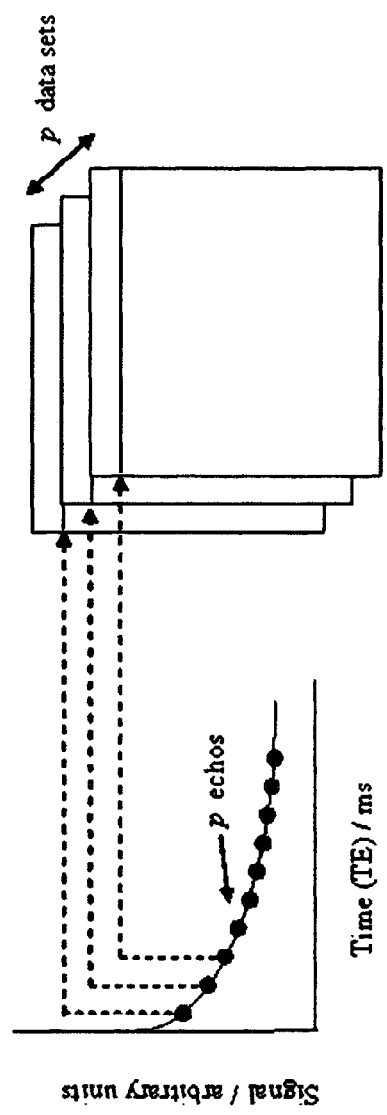
FIG. 3. Schematic diagram of a multiple echo acquisition in which each echo is stored in a separate data set. The result is images with different TEs.

FIG. 3 shows another approach in which the data from each echo of the multiple echoes is stored separately so that an image is obtained at each TE and then different images are then combined into a composite image or set of images. One previous study proposed matched-filtering as a way of combining multiple echo data sets that gives the theoretically optimal SNR at full spatial resolution [1]. However the contrast in the final image is degraded at least in part because the highest signals contribute most to the final image. The approach of making weighted linear combinations of the data from different TEs is very general and has been proposed independently using different SNR or contrast optimization criteria to determine weights [2],[3].

A variation on the second approach is to use specific mathematical functions to model the variation with TE, such as an exponential decay and/or an in- and out-of phase oscillation [4],[5]. Although the primary purpose of the modeling is to determine the chemical composition of the signal, a secondary consequence is that features not captured by the model are excluded. Ideally these are just noise and thus the modeling performs a crude de-noising of the images. The mathematical functions chosen for the model relate to the MRI physics although in general the signal can be decomposed into any basis set of functions. The basis set can be selected in accordance with the purpose of the data processing. For example, in magnetic resonance spectroscopy the signal is described in terms of set of complex exponential functions at different frequencies (i.e. by Fourier transform) since these relate to the chemical composition of the tissue.

For de-noising in MRI, it is desirable to separate the images into signal components and noise components and then discard the separated noise components while retaining the signal components. In one implementation, a method for magnetic resonance imaging may obtain MRI images acquired at different echo times subsequent to an excitation pulse to a sample which is being imaged and then perform a curve-fitting of a specified image signal parameter (e.g. exponential decay) in the acquired images at different echo times. This curve fitting is done in the MRI images for each pixel and the fitted parameters are then used to synthesize an image at any echo time with reduced noise.

The following sections describe SNR improvement by T2-decay fitting in multi-echo data sets. In certain tissues the MR signal intensity S has a known and simple dependence on the echo time (TE) given by $$S(TE)=A\exp(-TE/T2) \quad [10]$$

where A is a measure of proton density and T2 is a rate parameter, which is dependent on tissue type. By varying TE, contrast between adjacent tissues can be manipulated to increase the differentiation between them (for instance, gray matter and white matter). The TE that provides the best contrast depends on the T2s of the tissues, which are known for most tissues although their precise values are subject to some national variation.

If n measurements are made at different TE2 then A and T2 may be estimated from a non-linear least squares curve-fit of S(TE) to Eq 10. Once these parameters are known, it is possible to synthesize an image at arbitrate TE so the contrast can be fine-tuned. However errors in the measurements cause error in the estimated parameters, which in turn produce errors in the synthesized image. Simulation experiments show that if the S(TE) are contaminated by noise with standard deviation σ(original) then the synthesized images are also corrupted with noise but with a σ(synthesized) that depends on n and TE (see Table II).

Table II A numerical phantom was created from Eq 10 using A=20, TE=1, 2, ..., n and T2=3. Gaussian noise with σ=1.0 was added and the magnitude taken. An ROI (~2000 pixels) was used to measure a in the original and synthesized images.

| n | TE | σ (original) | σ (synthesized) | SNR gain |
|---|----|--------------|-----------------|----------|
| 3 | 1  | 1.01         | 0.96            | 5%       |
| 3 | 2  | 0.98         | 0.60            | 63%      |
| 4 | 1  | 1.02         | 0.94            | 9%       |
| 4 | 2  | 0.96         | 0.53            | 81%      |
| 5 | 1  | 0.99         | 0.89            | 11%      |
| 5 | 2  | 0.98         | 0.50            | 96%      |

Figures 14A, 14B, 14C:
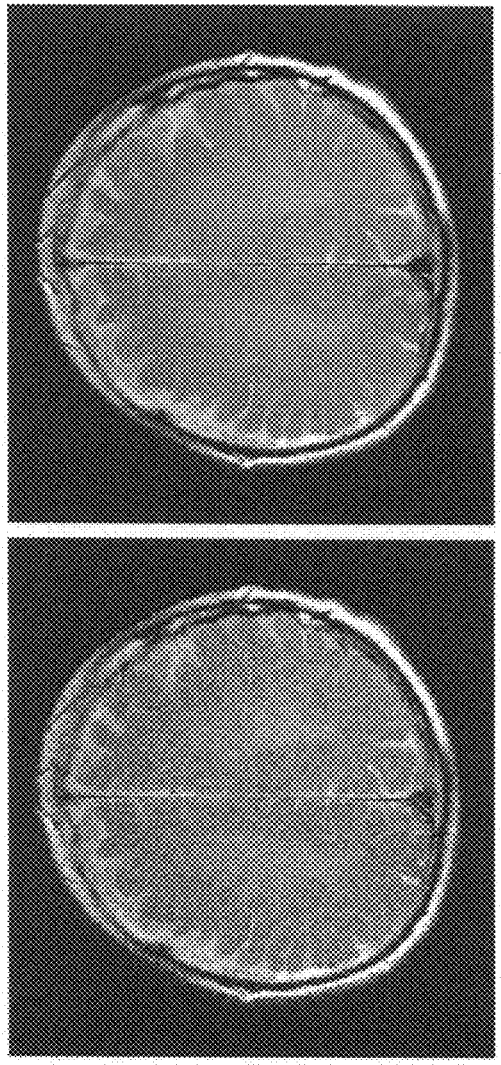
FIGS. 14A, 14B and 14C show test results of T2-decay fitting in multi-echo data sets.

A simple relationship between σ(synthesized) n and TE is not apparent from the simulation data although clearly the SNR is improved by increasing n. FIG. 14A shows a plot of σ(synthesized) against TE for a simulation using n=21 points over the range of 1 to 5. Also plotted is the SNR of the synthesized image. Similar (but not identical) curves are seen with different n and TE ranges.

FIGS. 14B and 14C show original and synthesized images from a fat saturated, multi-spin-echo sequence with n=8 and TE=12, 24, 36, .... A late echo image is shown. Exponential decays were fitted to the magnitude images at every pixel location using MATLAB's lsqcurvefit function. The processing time was approximately 5 minutes.

The processing method described can provide an improvement in SNR for certain types of acquisition; i.e. those where the signal follows an exponential decay with TE and the errors are random. Some exceptions are then in & out of phase behavior of fat/water, even-echo re-phasing in blood and radial streaking artifacts. In these cases the oscillatory variations tend to be averaged away, which may sometimes be beneficial—e.g. in radial acquisitions the streaking is reduced.

The change in signal with TE generally follows an exponential decay although can be complicated by the tissue composition and system imperfections that give rise to a range of variations. These variations can be modeled using mathematical functions derived from a physical model or alternately decomposed into a basis set of shapes without making any assumptions about the data; for instance, by a Fourier transform or wavelet transform. If only a subset of the basis set is needed to capture most of the signal variation then it becomes possible to suppress the least significant components and obtain a reduction in noise. This is the approach used in low-pass filtering (suppressing high frequencies) and other de-noising techniques. The method of SVD is an optimal technique for this type of data reduction, since each component of the basis set is calculated to maximally reduce the variance in the data [6]. Thus the first few components describe the majority of the variation while the last few typically just describe the noise.

In a second implementation, singular value decomposition (SVD) [6] can be used to identify a basis set of components for the TE variation. De-noising can be achieved by retaining the most significant components and suppressing the least significant components. Therefore, after the MRI images at different echo times are acquired, singular value decomposition and singular value filtering can be performed on the MRI images (or raw k-space data) to combine the MRI images (or raw k-space data) into a final data set with reduced noise. The following sections describe de-noising techniques based on SVD to reduce noise in multiple echo data sets with minimal loss of spatial resolution and image contrast.

Figure 4:
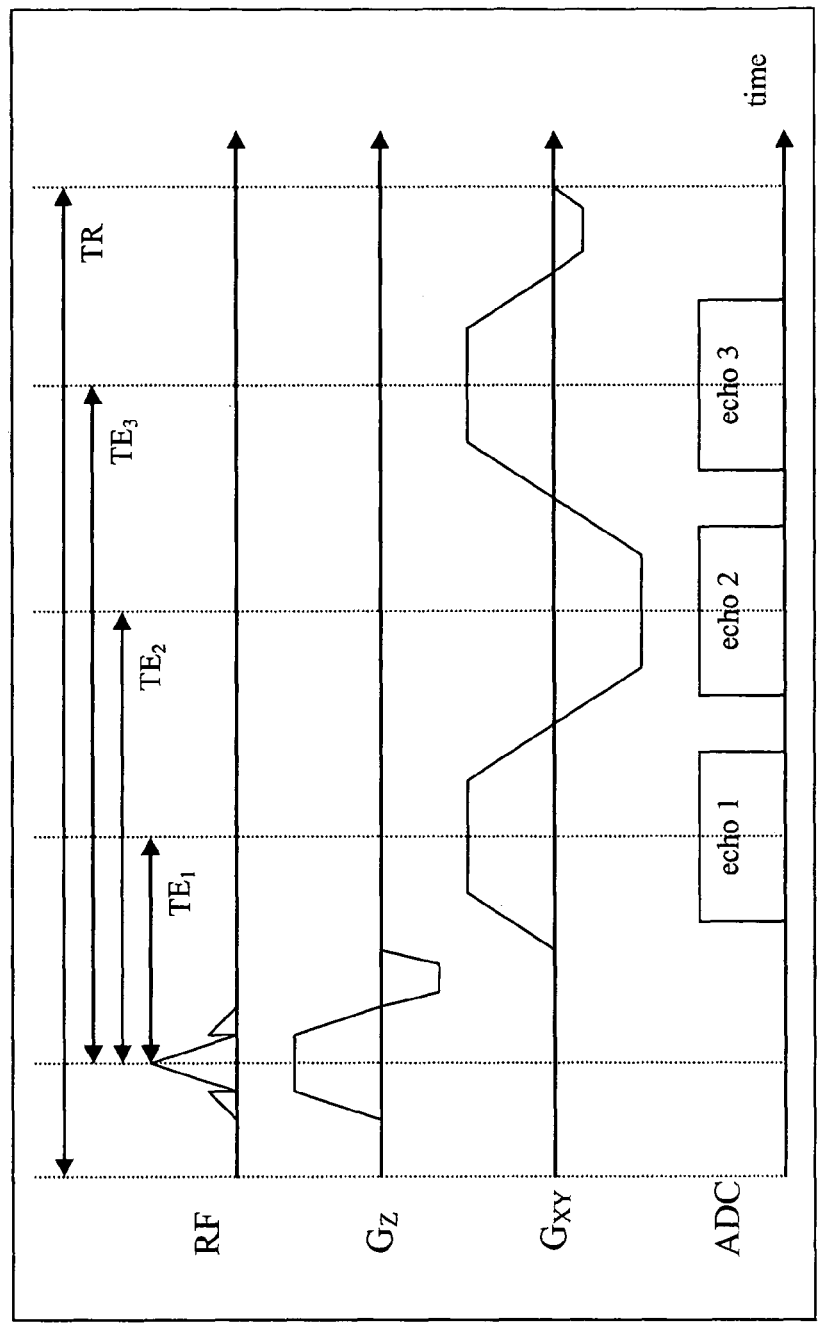
FIG. 4 shows an example of an MRI pulse diagram for a multiple echo gradient echo sequence.

FIG. 4 shows an example of an MRI pulse diagram for a multiple echo gradient echo sequence. Two or more data collection echoes represented by ADCs are performed at different TEs and multiple ADCs are acquired subsequent to the same RF excitation pulse per TR. The signal to noise ratio can be improved by combining the data from different echo times using the proposed technique without incurring an increase in the scan time. The SVD processing of the acquired images with different echo times may be processed in two different manners as shown in FIGS. 5 and 6.

1. Data Processing Using SVD

1.1 Data Matrix for SVD

De-noising of time-series data is an important and well-studied area of signal processing. Optimal methods have been developed for this type of analysis—notably SVD, which can be used to decompose the signal into a number of components ordered by their contribution to the variance. To determine the set of components for a multiple echo data set the TE variation of each pixel is stored as a row in a matrix H, which is then subjected to SVD. A data set of images of size m×n pixels acquired at p echo times is constructed into a matrix H as in (1)

$$H = \begin{bmatrix} \overset{\leftarrow p \rightarrow}{\cdots} \\ \cdots \\ \cdots \\ \cdots \\ \cdots \end{bmatrix} \updownarrow mn \tag{1}$$

where, in some MRI systems, mn is of the order $10^4$-$10^5$ and p is of the order $10^0$-$10^1$. The SVD returns three matrices $$H = USV^* \tag{2}$$

that are described in detail in standard texts [6]-[7]. Briefly, V contains the shapes ("right singular vectors") that comprise the components of the variation, S contains p positive scalars on the diagonal ("singular values") that describe the relative importance of each component and U contains coefficients that determine how much of each shape is present in each row of H. The asterisk denotes the Hermitian transpose operator.

1.2 Singular Value Filtering

If H is considered to consist of true signal $\overline{H}$ contaminated with Gaussian random noise N then $$H = \overline{H} + N \tag{3}$$

and the task of the data processing is to find an approximation of $\overline{H}$. It is well-known that $\overline{H}$ can be approximated by zeroing all but the largest k singular values $$H_k = US_k V^* \tag{4}$$

where $S_k$ is identical to S but with the $j^{th}$ diagonal element multiplied by the binary filter $$f_j = \begin{array}{c|c} 1 & j <= k \\ 0 & j > k \end{array} \quad j = 1, 2, \ldots, p \tag{5}$$

This approximation is optimal in the least squares sense, insofar as the Frobenius norm $\|H_k - H\|_F$, is the minimum for all rank k matrices; or, in other words, $H_k$ is the closest rank k matrix to H. The approximation is optimal when the signal is a linear combination of exactly k components corrupted with noise; for instance, if the signal comes from k tissues with distinct temporal variations then $H_k$ is the best possible approximation to $\overline{H}$. In practice, tissue variability and system imperfections perturb the signal creating a range of temporal variations therefore choosing a value for k can be somewhat arbitrary.

Instead, what may be preferable is a method that removes noise from H yet does not depend strongly on a particular parameter choice. Since H is expressed as the sum in (3), the singular values are given by $$\sigma_j = \sqrt{\overline{\sigma}_j^2 + \sigma_{noise}^2} \quad j = 1, 2, \ldots, p \tag{6}$$

where are the singular values of $\overline{H}$ and $\sigma_{noise}$ is one of the singular values of N (note: the singular values of a random matrix are approximately equal). From examining (6) it is apparent that applying a filter to $\sigma_j$ such that $f_j \sigma_j$ equals the true singular values $\overline{\sigma}_j$ will reduce the contribution from noise [8]. This filter that accomplishes this is given by (7)

$$f_j = \sqrt{1 - \frac{\sigma_{noise}^2}{\sigma_j^2}} \quad j = 1, 2, \ldots, p \tag{7}$$

The parameter $\sigma_{noise}$ may be determined from the noise variance in the images using the relation $\sigma_{noise} = \sqrt{mn \times variance}$ or otherwise by assuming rank($\overline{H}$)<p, in which case $\sigma_{noise} = \sigma_p$ (i.e. the smallest singular value of H). The latter is desirable since it makes the filtering process self-determining although the number of echoes p must be sufficient to ensure the inequality holds. (Note for complex data the relation is $\sigma_{noise} = \sqrt{2mn \times variance}$.)

1.3 Minimum Variance Filter

A similar filter to (7) is the so-called "minimum variance" filter [9]-[11] given by $$f_j = 1 - \frac{\sigma_{noise}^2}{\sigma_j^2} \quad j = 1, 2, \ldots, p \tag{8}$$

The minimum variance filter suppresses small singular values more strongly than (7) and can be shown to be the result of minimizing $\|HT - \overline{H}\|_F$ for all matrices T; in other words, $H_{mv} = HT$ is the best approximation of $\overline{H}$ that can be made by linearly combining the columns of H. In the present application, the columns contain the image pixels at each TE so the minimization results in the best approximation to the true (noise-free) data set that can be made by linearly combining the different images. The analytical expression for $H_{mv}$ is $$H_{mv} = UU^* \overline{H} \tag{9}$$

One advantage of the filters given in Eq 7 and Eq 8 over truncation Eq 5 is that the rank of $\overline{H}$ need not be known since the appropriate filter is determined from the data itself. However many different types of filter can be used.

The fact that it is the result of a meaningful optimization and has an analytical solution makes $H_{mv}$ an attractive choice as the singular value filter; this is the method used in the present study. As with any regularization procedure, however, the result can be biased in the sense that the expectation value of $H_{mv}$ is not necessarily equal to $\overline{H}$.

In the above SVD processing, all pixels in each of the acquired images at different echo times can be processed at the same time in five processing steps as shown in FIG. 5.

1.4 Adaptive Filtering

A variant on performing SVD on the whole field of view (FOV) simultaneously as shown in FIG. 5 is to perform the filtering adaptively on a small neighborhood around each pixel, e.g. within a radius r. Then each pixel is subjected to temporal filtering by an amount that depends on the local spatial properties of the image. For example, a neighborhood consisting of a single tissue (where every pixel decays the same way) will have only one significant component therefore all but one of the singular values can be suppressed by the minimum variance filter.

FIG. 6 shows a block diagram of one exemplary process for performing SVD processing and combining images from different echo times using adaptive filtering. Each acquired image is divided into a patchwork of smaller images and the SVD processing is performed on one image patch at a time using the process in FIG. 5. The process in FIG. 5 is repeated for all the image patches.

Adaptive filtering may have advantages when the signal has strong regional variations (e.g. due to magnetic field inhomogeneity) that cause the same tissue to exhibit different temporal behaviors at different locations. With whole FOV filtering, several components are required to preserve the signal variation across the image whereas local filtering may be able to compress the signal locally into fewer components. Another advantage of adaptive filtering may be when the noise variance differs across the image, since the performance of the de-noising depends on $\sigma_{noise}$ which is determined from the local noise variance rather than the entire image.

The images resulting from the adaptive filter may themselves be filtered, although there appears to be little change after the first iteration. The choice of r is also important since (6)-(9) are valid only in the limit that the number of rows in H greatly exceeds the number of columns, e.g. the neighborhood within a radius r requires $\pi r^2 \gg p$.

1.5 Noise in MRI

Depending on the reconstruction method used the images can be complex- or real-valued and can have Gaussian or Rician [12] noise with uniform or non-uniform variance across the image. The signal is often detected in parallel using more than one receiver coil since this provides higher SNR and offers the potential for faster acquisitions [13]. Combining the measurements from multiple coils has similarities to combining the measurements from multiple echoes—in fact, the matched filter mentioned in the Introduction is the theoretically optimal method for doing this [14] although it is impractical and so minor variants are often used, e.g. [14]-[16].

Examples of some common reconstructions and their noise properties are: (i) a sum of squares reconstruction has Rician noise with uniform noise variance [14]; (ii) a matched filter reconstruction has Gaussian noise with uniform noise variance [15],[16]; (iii) a sensitivity-encoding (SENSE) reconstruction has Gaussian noise with non-uniform noise variance [13]. To conform to (3) it may be preferable to use reconstruction methods that have a uniform Gaussian noise distribution, however for the de-noising to be most effective it may be preferable to remove the phase from the images which results in a Rician noise distribution.

The reason for taking the magnitude is that it removes phase variations from the images and results in fewer temporal variations in the decay. Often the magnitude holds the clinically useful information and the phase is relatively unimportant, particularly since the phase is strongly influenced by system imperfections such as local magnetic field perturbations [17] that are irrelevant to the clinical diagnosis. Phase variations can cause similar tissues to behave differently from pixel to pixel so that the number of components needed to describe the variation is increased, which in turn reduces the de-noising capability because SVD filtering relies on being able to compress the variation into few components.

Although the noise should strictly be Gaussian distributed the results from the present study indicate there are no significant errors introduced when the assumption is violated by using images with Rician distributed noise and/or non-uniform noise variance. The value of $\sigma_{noise}$ is underestimated in the former case and indeterminate in the latter case, causing under- or over-filtering. In all examples used the observed effect is negligible. Pre-whitening has been suggested as a way to recover the correct noise distribution although requires additional information [6],[11].

Frequently only the amplitude of the complex images is needed however taking the amplitude results in Rician noise. Therefore a phase-correction is performed so most of the signal resides in the real part whilst noise remains equally in both real and imaginary parts. The advantage of this is that large phase variations are removed from the images and therefore fewer significant types of temporal variation are present. In terms of SVD filtering, this manifests as there being fewer significant singular values hence there is greater scope for de-noising.

2. Test Methods and Results

Data processing software based on the above SVD processing was used test the performance of the above MRI data acquisition shown in FIG. 4 and the subsequent SVD processing. Tests were conducted using both a Symphony Quantum 1.5T (Siemens Medical Solutions USA, PA) scanner and a TwinSpeed 1.5T scanner (General Electric Healthcare, WI).

In tests with the Siemens Symphony Quantum 1.5T scanner, data sets were acquired on using multi-echo spin-echo (TR 500, TE 12, 24, 36, . . . ) and gradient echo (TR 100, TE 2.2, 3.0, 3.8, . . . ) sequences with up to 16 echoes. A 3-element spine array coil and a birdcage head coil were used to acquire images of phantoms and volunteers. Data processing was performed in MATLAB (The Mathworks, MA) and computation times were approximately 1-2 seconds. Adaptive filtering was performed on a pixel by pixel basis and with r=10 took approximately 1-2 minutes per data set.

A suggested algorithm for the method is given here:

```
function out=svd_multiple_echo_filter(in)
    [m n p]=size(in);
    H=reshape(in,m.*n,p);
    [U S V]=svd(H,0);
    S=diag(S);
    f=1-(S(p)./S).^2;
    S=diag(f.*S);
    H=U*S*V';
    out=reshape(H,m,n,p);
``` in the MATLAB programming language. The input argument 'in' is the multi-echo data set and the output argument 'out' contains the filtered images. FIGS. 7, 8A, 8B and 8C show the test results.

In some experiments phantoms were prepared with a 20% fat emulsion Intralipid (Baxter, Ill.) and an iron-based T2* contrast agent Feridex (Berlex, N.J.), as follows: (i) $CuSO_4$ doped water, (ii) Intralipid and (iii) Feridex doped water. Human volunteers gave written informed consent prior to scanning.

The SNR was calculated as the ratio of the mean to the standard deviation inside a user-drawn region of interest (ROI) inside the phantom/brain containing approximately 100 pixels. The measured standard deviation has a contribution from the signal variation inside the ROI as well as the noise but this was minimized by using an ROI in which the signal appeared constant.

FIGS. 9A-9H show phantom results from a SPGR sequence with 16 echoes. Scan parameters were: 1-element of the spine coil, matrix 128×128, $\alpha=30°$, bandwidth 1150 Hz/pixel, TR 160 ms, TE=2.26, 3.70, . . . , 23.86 ms.

Figure 9A:
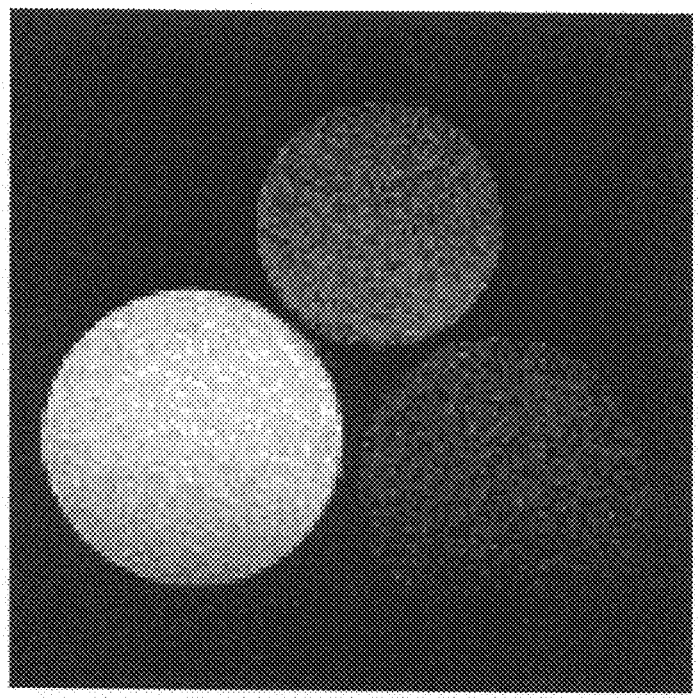
FIG. 9A. Phantoms containing (from left to right) (i) $CuSO_4$ doped water, (ii) Intralipid and (iii) Feridex doped water (see Methods). An SPGR sequence was used and images were acquired at 16 TEs; shown is the last echo (TE 23.86 ms).
Figure 9B:
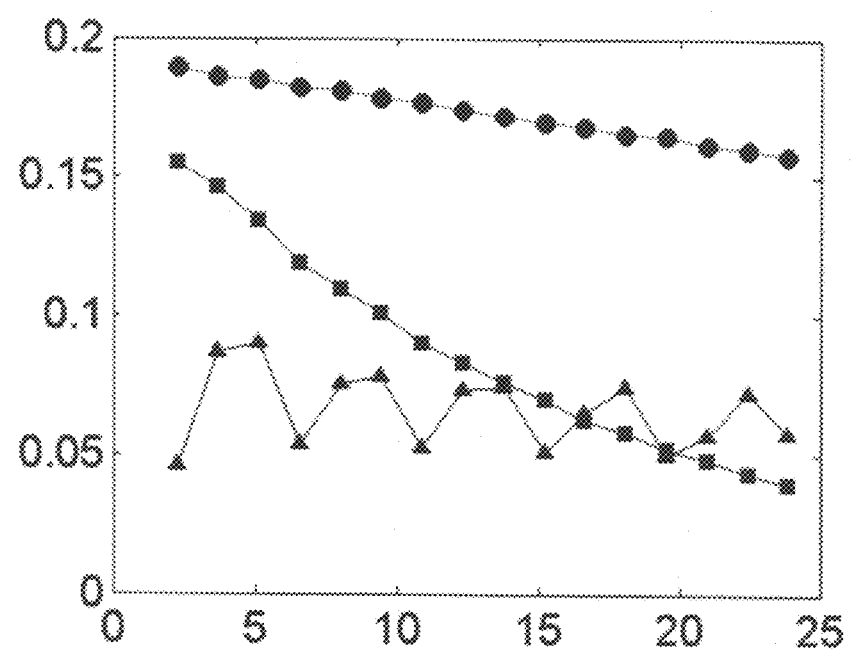
FIG. 9B. Plot of signal magnitude versus TE in an ROI at the center of each phantom: (i) circle, (ii) triangle and (iii) square, showing three distinct types of temporal variation; namely—a slow decay, an oscillating slow decay and a fast decay.
Figure 9C:
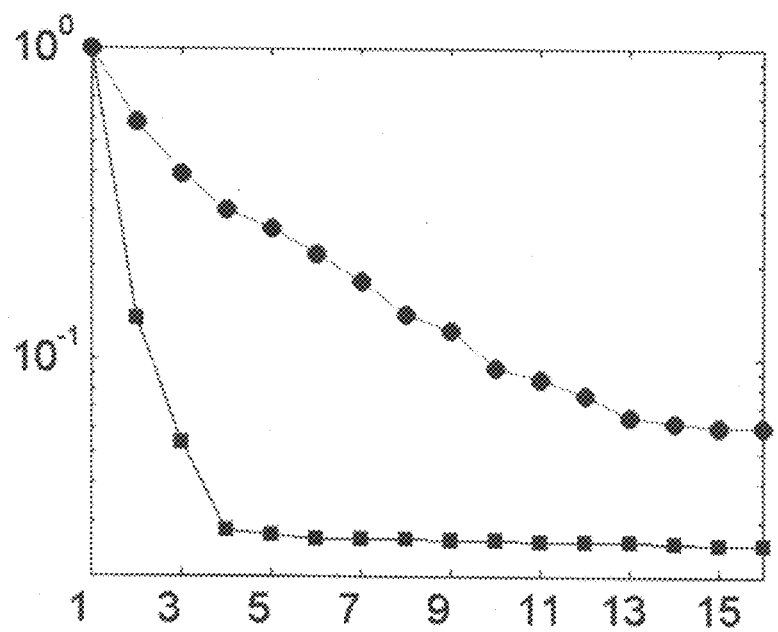
FIG. 9C. Semi-log plot of the singular values for data processing performed using complex (circle) and magnitude (square) images. The singular values have been normalized so the largest is 1 in both cases. The magnitude plot indicates only three singular values are significant whereas the complex plot indicates all the singular values are significant, as there is no obvious leveling off in the plot. The reason for this must be due to phase variations, which are absent when using magnitude images.
Figure 9D:
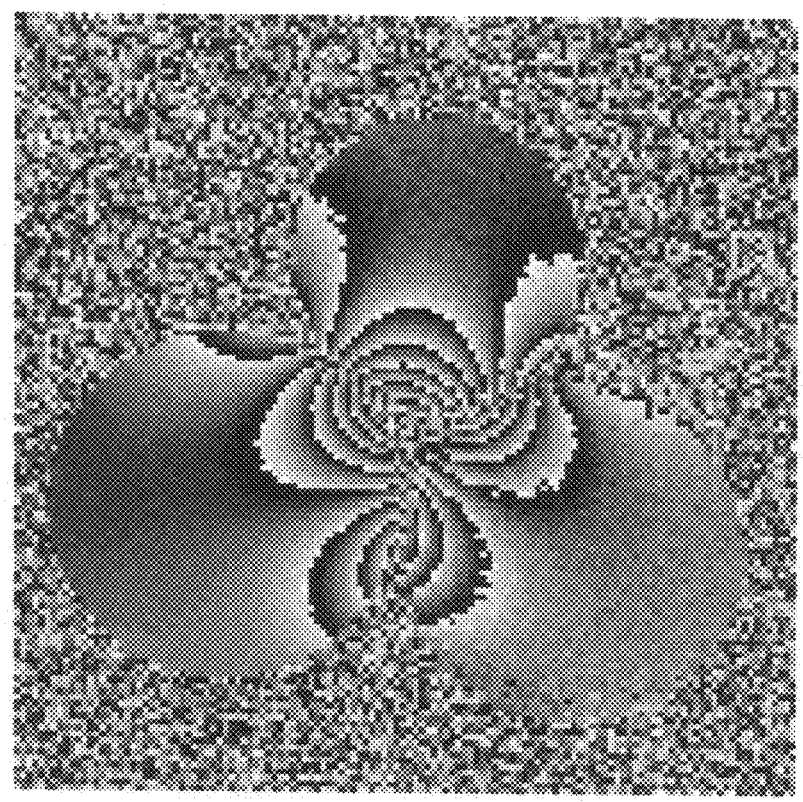
FIG. 9D. The phase of the image in (a) confirms that significant phase evolution occurs during the time between the first and last echoes, presumably due to magnetic susceptibility. Often it is unnecessary to preserve phase variations since the magnitude contains the clinical information.
Figure 9E:
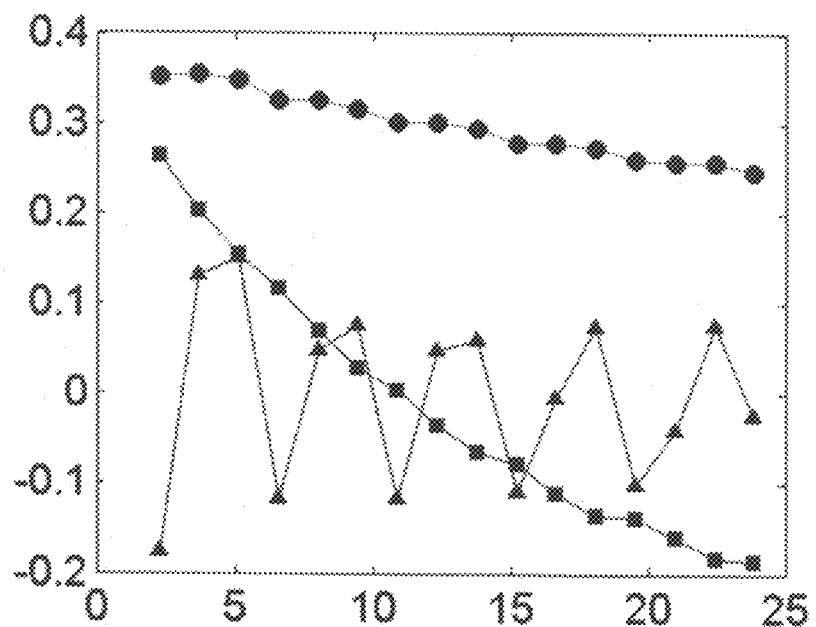
FIG. 9E. Plot of the three most significant singular vectors in the magnitude images. Note there is some similarity between these shapes and the actual variations in the data shown in FIG. 9B—although in general there is no clear correspondence between the data and the singular vectors.
Figure 9F:
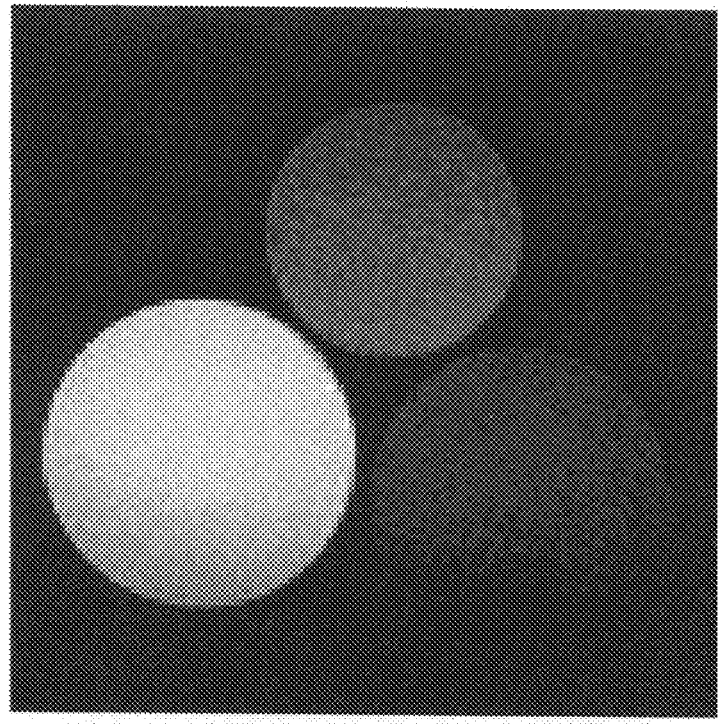
FIG. 9F. The same image as shown in (a) following de-noising of the magnitude data using the minimum variance filter (8). Note that the contrast is the same but the noise is reduced. Earlier TE images exhibit similar or greater noise reduction (see Table I).

FIG. 9A shows the image at the last TE. FIG. 9B shows a plot of the signal magnitude in an ROI at the center of each phantom versus TE. FIG. 9C shows a plot of the log of the singular values from a SVD of the variation with TE of the magnitude and complex images. The smallest singular value ($\sigma_{noise}$) for the complex images should be $\sqrt{2}$ times that of the magnitude images. That it is higher than this indicates either rank($\bar{H}$)=p for the complex data set or $\sigma_{noise}$ is underestimated in the magnitude data set, which is likely given the Rician noise distribution. FIG. 9D shows the phase last TE demonstrating significant phase evolution in the complex images that is absent in the magnitude images. This variation accounts for the broad spread of singular values in the complex data set compared to the magnitude. FIG. 9E shows a plot of the first three components of the magnitude variation. FIG. 9F shows the de-noised image at TE 23.86 ms using the minimum variance filter.

Figure 9G:
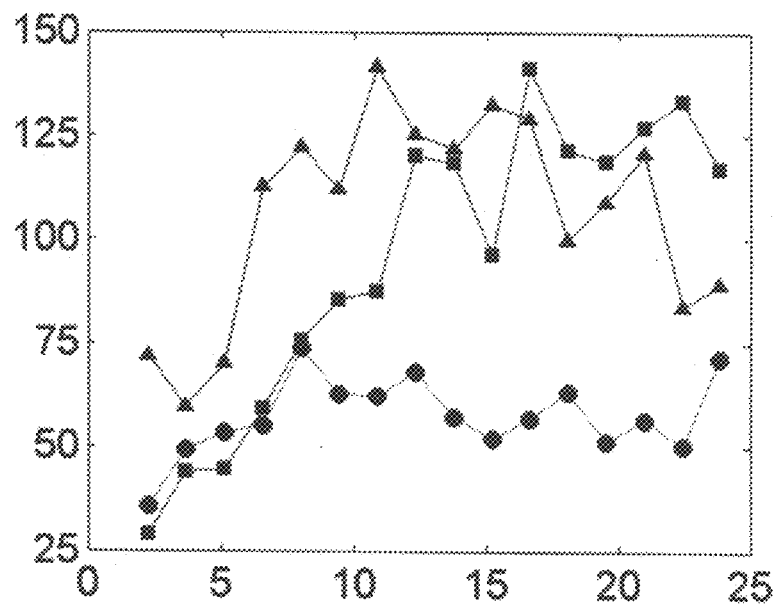
FIG. 9G. Percentage increase in SNR versus TE in the three phantoms following de-noising (i) circle, (ii) triangle and (iii) square.

FIG. 9G shows the percentage SNR increase in the de-noised images at each TE. Specific SNR measurements given in Table I. The results show the middle and last echoes tend to experience the greatest SNR improvements although there are also gains in the first echo. Other than an overall increase in the SNR, a general trend in the variation of SNR with TE is difficult to discern since it depends on the specific composition of the sample.

Figure 9H:
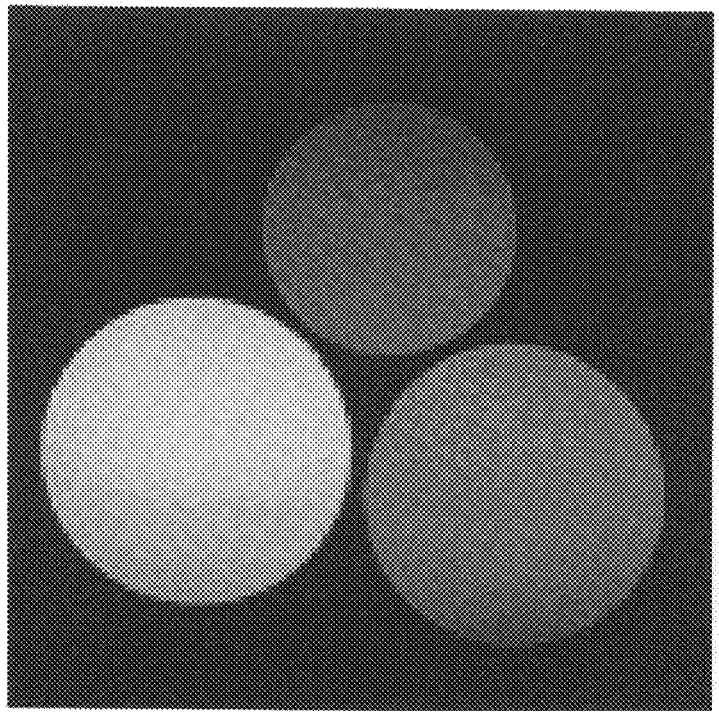
FIG. 9H. The image produced by matched filtering. Compared with (a) and (f) the SNR is noticeably higher although the contrast is different, since each echo in the summation is weighted by its signal.

FIG. 9H shows the image produced by a matched filter summation [1], whereby the weights are given by the signal itself. This approach optimally maximizes the SNR, e.g. compared with Table I the SNR is (i) 39.3, (ii) 26.9 and (iii) 29.4 for each phantom, although the combined image is weighted in favor of images that have high signal and therefore the contrast reflects the short TE images.

Table I

SNR measurements inside the three phantoms shown in FIG. 3. From left to right: (i) $CuSO_4$ doped water, (ii) Intralipid and (iii) Feridex doped water. The SNR was calculated as described in Methods. De-noising was performed with the minimum variance filter (8). In all cases a gain in SNR is observed.

| | Phantom (i) | Phantom (ii) | Phantom (iii) |
|---|---|---|---|
| TE 2.26 (original) | 17.4 | 4.4 | 12.3 |
| TE 2.26 (de-noised) | 23.6 | 7.5 | 15.9 |
| TE 12.34 (original) | 16.6 | 6.8 | 7.4 |
| TE 12.34 (de-noised) | 27.9 | 15.4 | 16.2 |
| TE 23.86 (original) | 12.4 | 5.7 | 3.9 |
| TE 23.86 (de-noised) | 21.3 | 10.8 | 8.5 |

Figure 10A:
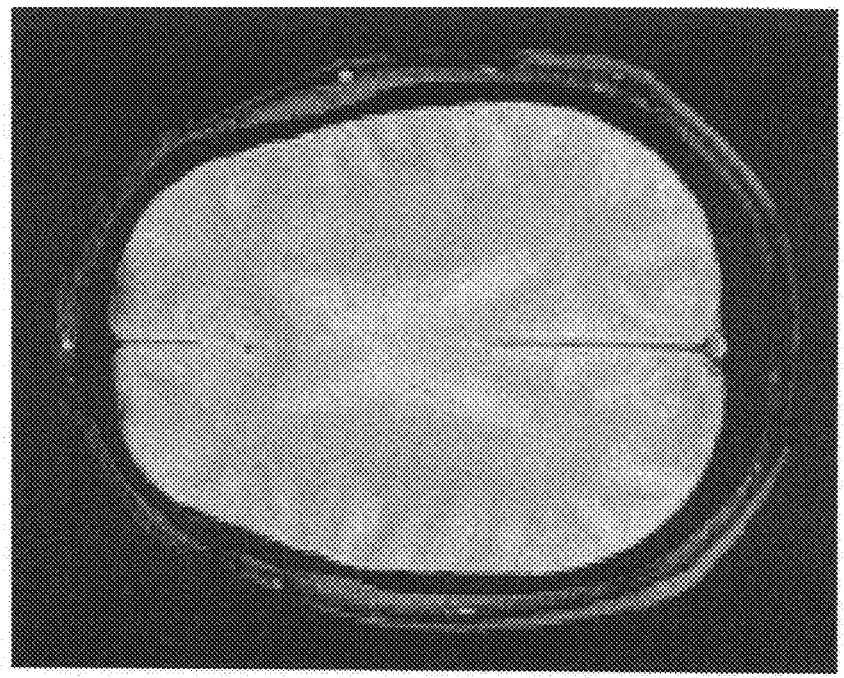
FIG. 10A. Image from a SPGR sequence at TE 25 ms. The mean signal inside an ROI positioned right of the ventricles (shown) is 1.014 with standard deviation 0.053—giving an SNR of 19.1.
Figure 10B:
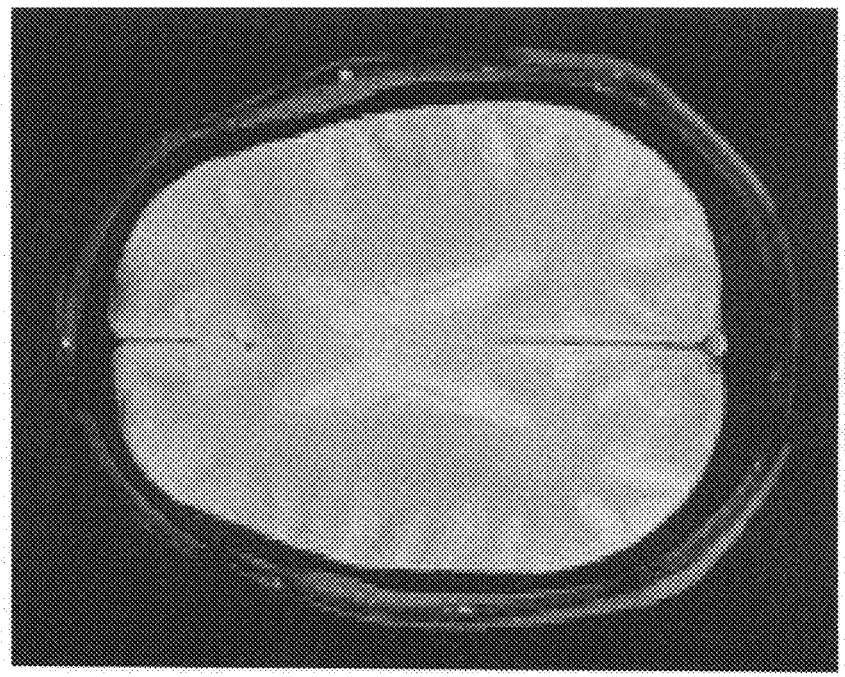
FIG. 10B. The filtered image. The mean signal inside the same ROI is 1.015 with standard deviation 0.035 giving an SNR of 29.0.
Figure 10C:
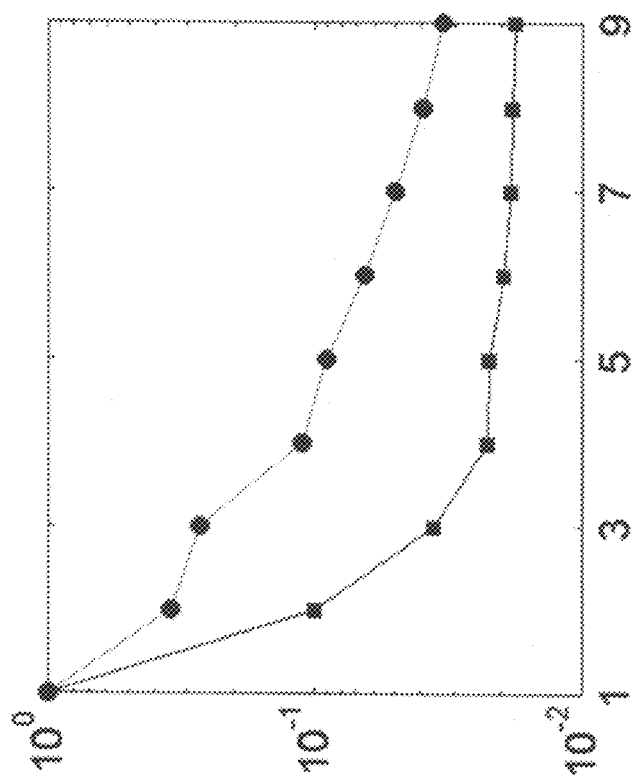
FIG. 10C. Semi-log plot of singular values. There appear to be 3 significant singular values in the magnitude data (square) whereas all of them are significant in the complex data (circle).
Figure 10D:
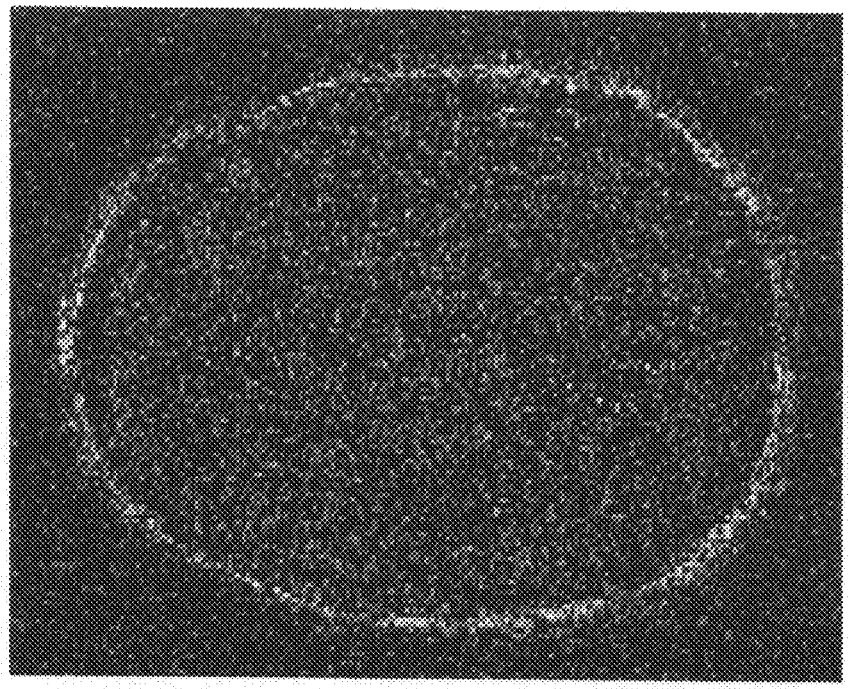
FIG. 10D. The absolute difference between the images in FIGS. 10A and 10B. Note that the window and level scaling is 10× that of the other images.

FIGS. 10A-10D show results from a SPGR sequence with 9 echoes. Scan parameters were: head coil, matrix 256×144, $\alpha=35°$, bandwidth 545 Hz/pixel, TR 742 ms, TE=5.2, 8.5, . . . , 31.6 ms. FIG. 10A shows the image at TE 25.0 ms, corresponding with the TE used for clinical scans. FIG. 10B shows the de-noised image. There is a 53% improvement in SNR in this image. FIG. 10C shows a plot of the singular values for magnitude and complex data. As with the phantom data, the spread of singular values is much broader with the complex data. FIG. 10D shows the difference image between FIGS. 10A and 10B.

Figure 11A:
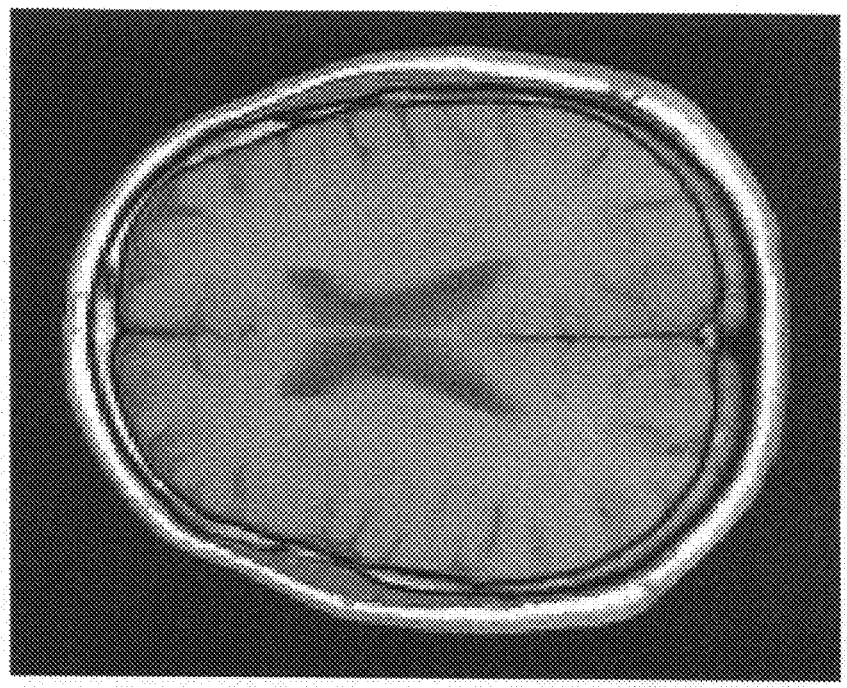
FIG. 11A. Image from a spin echo sequence at TE 15.2 ms. The mean signal inside an ROI positioned right of the ventricles (shown) is 1.175 with standard deviation 0.069 giving an SNR of 17.0.
Figure 11B:
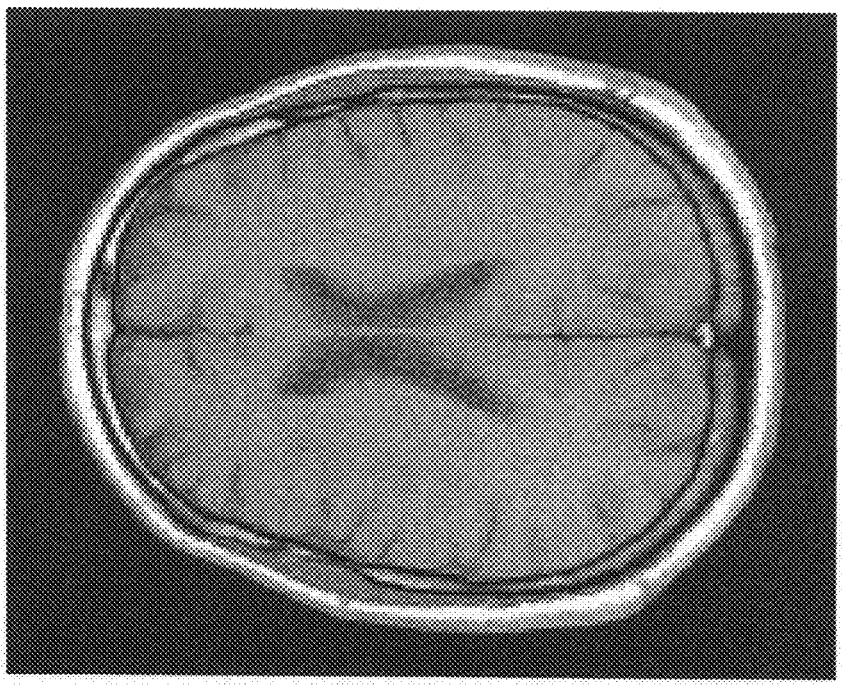
FIG. 11B. De-noised image. The mean signal in the same ROI is 1.173 with standard deviation 0.043 giving an SNR of 27.3.

FIGS. 11A-11D show results from a spin echo sequence with 5 echoes. Scan parameters were: head coil, matrix 256× 240, $\alpha=90°$, bandwidth 780 Hz/pixel, TR 478 ms, TE=7.6, 15.2, . . . , 38.0 ms. FIG. 11A shows the image at TE 15.2 ms, corresponding with the TE used for clinical scans. FIG. 11B shows the de-noised image. There is a 58% improvement in SNR in this image. FIG. 11C shows a plot of the singular values for magnitude and complex data. In contrast to the SPGR sequences, the spread of singular values with the spin echo sequence is similar for both magnitude and complex data. This demonstrates the fact that spin echoes refocus the phase variations caused by magnetic field inhomogeneity whereas gradient echoes do not. FIG. 11D shows the difference image between FIGS. 11A and 11B.

Figure 12A:
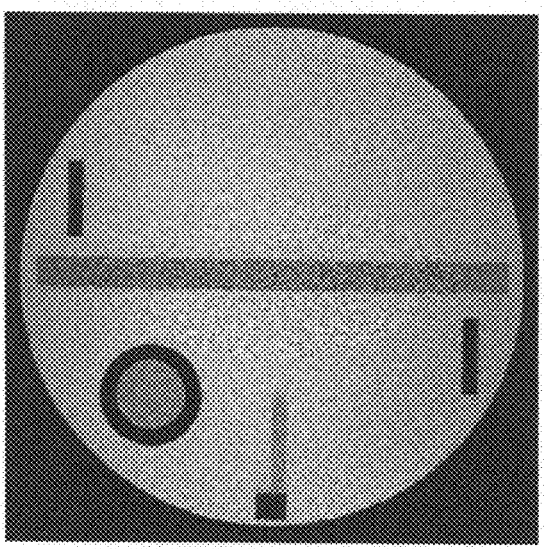
FIG. 12A. The original SENSE reconstructed image from a 3× accelerated SPGR acquisition with 8 echoes. The image at TE=4.0 ms is shown.
Figure 12B:
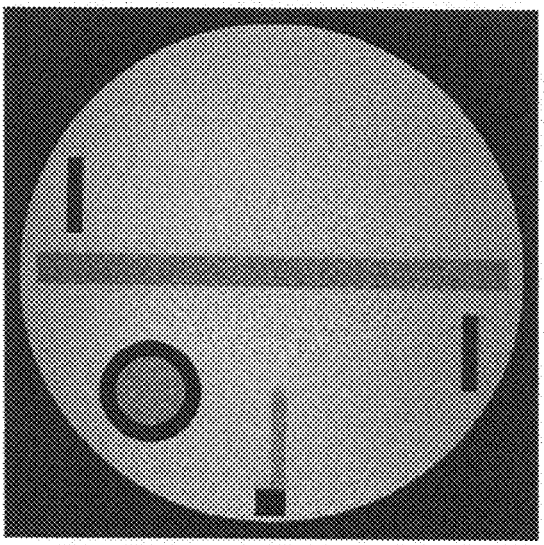
FIG. 12B. The image following whole FOV filtering of the complex data set. A reduction in noise is observed.
Figure 12C:
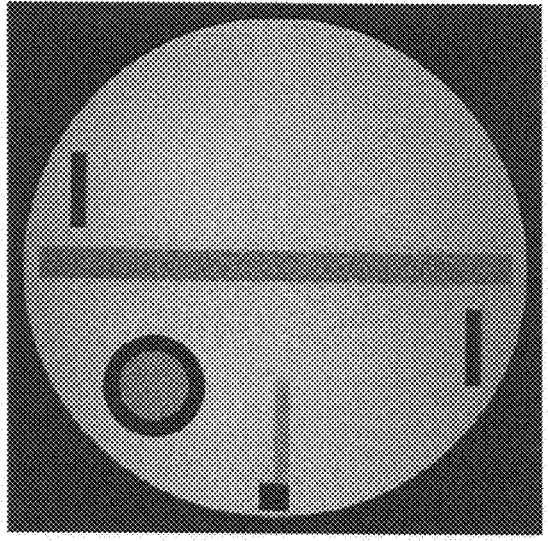
FIG. 12C. The image following adaptive FOV filtering of the complex data set. A further, albeit minor, reduction in noise is observed compared with the whole FOV filtered image in FIG. 12B.

FIGS. 12A-12C show results from adaptive filtering on complex images from a SENSE 3× accelerated SPGR acquisition with 8 echoes. Scan parameters were: 3-elements of the spine coil, matrix 252×252, $\alpha=30°$, bandwidth 410 Hz/pixel, TR 100, TE=4.0, 7.5, . . . , 28.6 ms. FIG. 12A shows the original image at TE 4.0 ms exhibiting spatially varying noise. FIG. 12B shows the image following whole FOV filtering and FIG. 12C shows the image following adaptive filtering with radius r=10 containing 347 neighboring pixels. The noise reduction is greater in the adaptively filtered image than the whole FOV filtered image.

Figure 13C:
FIG. 13C. The magnitude of the difference between the two images where the window and level scaling are 10 times of that of the other images.
Figure 13B:
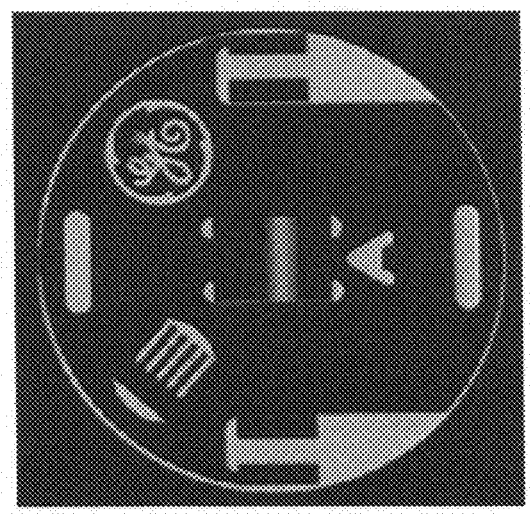
FIG. 13B. The image following de-noising of the magnitude data set. As well as an expected noise reduction there is an improvement in the radial streaking artifacts, notably in the bottom left of the phantom.
Figure 13A:
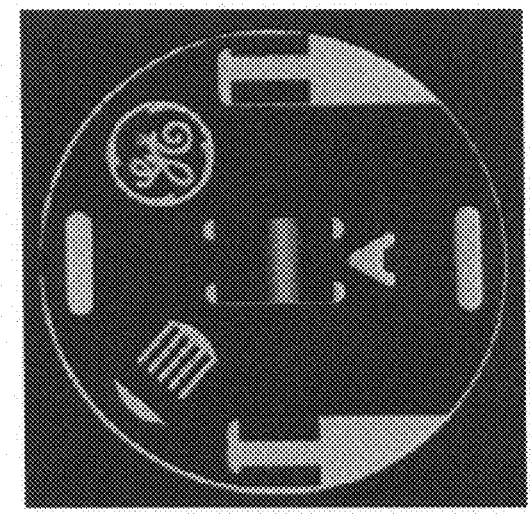
FIG. 13A. The image at TE 15.7 ms from non-rectilinear sampled SPGR sequence with 12 echoes.

FIGS. 13A-13C show results from a non-rectilinear (radially sampled) SPGR sequence with 12 echoes. Scan parameters were: head coil, 255 radial spokes, 256 readout points per spoke, matrix 256×256, $\alpha=30°$, bandwidth 976 Hz/pixel, TR 120 ms, TE=0.008, 3.9, . . . , 43.3 ms. FIG. 13A shows the image at TE 15.7 ms and FIG. 13B shows the same image following de-noising of the magnitude data. An expected reduction in noise is observed but there is also a reduction in the streaking artifacts characteristic of radial sampling. FIG. 13C shows the difference image magnified 10× for viewing. In principle the streaking artifacts should be the same regardless of the TE—however small variations from echo to echo, presumably due to eddy currents, cause the streaks to vary slightly in each image, which means they are able to be suppressed by the filtering.

For the situation pertaining to (3) the singular values of H give an indication of the number of significant components in the basis set. The smallest singular value $\sigma_p$, also gives an estimate of the noise variance as long as the inequality $k<p$ holds, where k is the number of significant components and p is the number of echoes. In general it is difficult to know how many significant components will be present in a data set and hence the number of TE measurements necessary to satisfy the inequality—increasing the number of echoes and using magnitude images helps. A way to avoid explicitly specifying k is to use the "minimum variance" filter (8), which yields the best possible approximation to the noise-free data set that can be made from a linear combination of the different TE images. The minimum variance filter has been used in applications such as acoustic noise reduction [11] and magnetic resonance spectroscopy [19]. As a crude estimate there are two types of variation per tissue (T2 decay and chemical shift precession) and two tissues present (fat and water) therefore a minimum of $p>4$ is necessary to satisfy $rank(\overline{H})<p$.

The noise term in (3) is assumed to be Gaussian, although the noise in MRI can depend on the method used for image reconstruction. It is common to reconstruct magnitude images that have Rician distributed noise or use methods that result in non-uniform noise variance across the image [12], [16], which violates the Gaussian noise assumption. Refinements to the method may include pre-whitening the noise and subtracting the mean from the data [6],[11] although the de-noising appears to be effective even when such steps are not taken (FIG. 6). Otherwise, by a careful choice of reconstruction algorithm, it may be possible in some cases to preserve uniform Gaussian noise for the SVD filtering then perform intensity and other corrections afterwards.

It is not currently known where the best SNR/scan time trade-offs are between filtering multiple echoes with SVD, decreasing the readout bandwidth, increasing TR, using higher turbo factors, parallel imaging, partial Fourier, making use of both spin and gradient echoes. Particularly with the latter, SVD echo filtering can take advantage of optimized multi-echo sequences such as echo planar imaging that acquire many echoes in the shortest possible time by collecting data on forward and reverse gradients and sampling on the gradient ramps. The chemical shift artifacts from opposed gradient direction tend to get averaged away by filtering, which may be an advantage.

Multiple echo combination techniques have been proposed previously [1]-[3] although to date have not become widely used in clinical practice. Thus their role in optimizing the SNR, scan-time and contrast in MRI has been overlooked compared to other scanning parameters used in MRI such as bandwidth, TR, averaging, phase over-sampling, flip angle, turbo factor and SENSE speedup factor. The present technique minimizes the loss of resolution and contrast when combining the images from different TEs so it may be useful in improving the SNR in certain applications, e.g. those requiring strong T2 weighting through the use of a long TE. Increasing the number of echoes is a time-efficient method of data acquisition compared to, say, signal averaging and can be viewed a way of reducing the readout bandwidth without incurring T2* blurring or chemical shift artifacts.

Implementation of multiple echo sequences is relatively simple and, particularly with gradient echoes, a large number of echoes can be acquired in a short time by sampling on the gradient ramps and collecting data on both forward and reverse gradients, as in echo planar imaging. Chemical shift artifacts from using opposed readout gradient directions tend to be averaged away by the filtering, which may be an advantage in some cases. A similar effect is observed with any type of artifact that varies from echo to echo; for example, radial streaking (FIGS. 13A-13C).

Embodiments of the invention and all of the functional operations described in this specification can be implemented in digital electronic circuitry, or in computer software, firmware, or hardware, including the structures disclosed in this specification and their structural equivalents, or in combinations of one or more of them. Embodiments of the invention can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understand as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Only a few implementations are described. Other variations, enhancements and modifications are possible.

4.1 References

1. D Lu and P M Joseph, "A matched filter echo summation technique for MRI," Magn Reson Imaging, vol. 13, pp. 241-249, 1995
2. D Greve, C West, A van der Kouwe and A Dale, "Weighting of Multiple Gradient Echo Images to Improve Detection of fMRI Activation," Proceedings of the Human Brain Mapping Conference pp. 842, 2003
3. T Brosnan, G Wright, D Nishimura, Q Cao, A Macovski and F G Sommer, "Noise Reduction in Magnetic Resonance Imaging," Magn Reson Med, vol. 8, pp. 394-409, 1988
4. G H Glover, "Multipoint Dixon Sequences for Proton Water, Fat and Susceptibility Imaging," J Magn Reson Imag vol. 1, pp. 521-530, 1991
5. S B Reeder, Z Wen, H Yu, A R Pineda, G E Gold, M Markl and N J Pelc, "Multicoil Dixon Chemical Species Separation With an Iterative Least-Squares Estimation Method," Magn Reson Med vol. 51, pp. 35-45, 2004
6. A Hyvarinen, J Karhunen and E Oja, Independent Component Analysis. New York: John Wiley & Sons, 2001 pp. 125-144
7. W H Press, S A Teukolsky, W T Vetterling, B P Flannery, Numerical Recipes in C (2nd ed). Cambridge: Cambridge University Press; 1992 pp. 59
8. S Y Kung, K S Arun K S and D V B Rao, "State-space and singular-value decomposition-based approximation methods for the harmonic retrieval problem," J Opt Soc Am vol. 73, pp. 1799-1811, 1983
9. S Van Huffel, "Enhanced resolution based on minimum variance estimation and exponential data modeling," Signal Processing vol. 33, pp. 333.355, 1993
10. B De Moor, "The Singular Value Decomposition and Long and Short Spaces of Noisy Matrices," IEEE Transactions on Signal Processing, vol. 41, pp. 2826-2838, 1993
11. S H Jensen, PC Hansen, S D Hansen and J A Sorensen, "Reduction of Broad-Band Noise in Speech by Truncated QSVD," IEEE Transactions on Speech and Audio Processing, vol. 3, pp. 439-448, 1995
12. A H Andersen, "The Rician distribution of noisy MRI data," Magn Reson Med, vol, 36, pp. 331-333, 1996
13. K P Pruessmann, M Weiger, M B Scheidegger and P Boesiger, "SENSE: sensitivity encoding for fast MRI," Magn Reson Med, vol. 42, pp. 952-962, 1999
14. P B Roemer, W A Edelstein, C E Hayes, S P Souza and O M Mueller, "The NMR phased array," Magn Reson Med, vol. 16, pp. 192-225, 1990
15. D O Walsh, A F Gmitro and M W Marcellin, "Adaptive reconstruction of phased array MR imagery," Magn Reson Med, vol. 43, pp. 682-690, 2000
16. M Bydder, D J Larkman and J V Hajnal, "Combination of signals from array coils using image-based estimation of coil sensitivity profiles," Magn Reson Med vol. 47, pp. 539-548, 2002
17. D C Noll, C H Meyer, J M Pauly, D G Nishimura and A Macovski, "A homogeneity correction method for magnetic resonance imaging with time-varying gradients," IEEE Trans Med Imag, vol. 10, pp. 629-637, 1991
18. M D Robson, Gatehouse P D, Bydder M and Bydder G M, "Magnetic Resonance: An Introduction to Ultrashort TE (UTE) Imaging," J Comput Assist Tomogr vol. 27, pp. 825-846, 2003
19. W W F Pijnappel, A Vandenboogaart, R Debeer, D Vanormondt, "SVD-based Quantification of Magnetic-Resonance Signals," J Mag Res, vol. 97, pp. 122-134, 1992

What is claimed is:

1. A method for magnetic resonance imaging (MRI), comprising:
   obtaining a plurality of MRI images acquired at different echo times subsequent to an excitation pulse applied to a sample which is being imaged;
   performing a curve-fitting for a specified variation in each pixel of the MRI images to produce fitted parameters; and
   using the fitted parameters for the specified variation in the MRI images to synthesize the MRI images to form an image at any echo time with reduced noise.
2. The method as in claim 1, wherein the specified variation is a variation of a signal amplitude in each pixel over echo times.
3. The method as in claim 2, wherein the variation is an exponential decay.
4. The method as in claim 1, wherein the specified variation is obtained via a Fourier transform.
5. The method as in claim 1, wherein the specified variation is obtained via a wavelet transform.
6. The method as in claim 1, further comprising:
   dividing each of the MRI images into subsets of adjacent pixels; and
   performing the curve fitting and image synthesis on each subset separately.

7. A method for magnetic resonance imaging (MRI), comprising:
   performing a curve-fitting for a specified variation in each pixel of a plurality of MRI images acquired at different echo times subsequent to an excitation pulse applied to a sample; and
   using fitted parameters for the specified variation in the MRI images to synthesize the MRI images to form an image at any echo time with reduced noise.

8. A computer program product, encoded on a computer-readable medium, operable to cause data processing apparatus to perform operations comprising:
   performing a curve-fitting for a specified variation in each pixel of a plurality of magnetic resonance imaging (MRI) images acquired at different echo times subsequent to an excitation pulse applied to a sample; and
   using fitted parameters for the specified variation in the MRI images to synthesize the MRI images to form an image at any echo time with reduced noise.

9. The product as in claim 8, wherein the variation is an exponential decay.

10. The product as in claim 8, wherein the specified variation is obtained via a Fourier transform.

11. The product as in claim 8, wherein the specified variation is obtained via a wavelet transform.

12. A method for magnetic resonance imaging (MRI), comprising:
   obtaining a plurality of MRI images acquired at different echo times subsequent to an excitation pulse applied to a sample which is being imaged; and
   performing an analysis of variations of pixels of the MRI images to synthesize the MRI images to form an image at any echo time with reduced noise, wherein performing the analysis comprises performing a singular value decomposition and singular value filtering on data of the MRI images to combine information of the MRI images into a final data set with reduced noise.

13. The method as in claim 12, wherein performing the analysis comprises:
   constructing a matrix from the MRI images of different echo times;
   decomposing the matrix into a product of first, second, and third matrix, wherein the first matrix includes information on variations amongst the MRI images at different echo times, the second matrix includes information on relative importance of each signal component, and the third matrix includes information on content in each image pixel;
   reducing the second matrix into a reduced second matrix;
   using the first, the reduced second matrix and the third matrix to produce a new matrix; and
   using elements in the new matrix to produce the final data set.

14. The method as in claim 13, wherein reducing the second matrix into a reduced second matrix comprises applying a filter to the diagonal elements.

15. The method as in claim 14, wherein the filter is a minimum variance filter.

16. The method as in claim 14, wherein the filter is a binary filter.

17. The method as in claim 12, wherein performing the analysis comprises performing the singular value decomposition and the singular value filtering to all pixels in the MRI images.

18. The method as in claim 12, wherein performing the analysis comprises:
   dividing each of the MRI images into subsets of pixels; and
   performing the singular value decomposition and singular value filtering on each subset separately.

19. A method for magnetic resonance imaging (MRI), comprising:
   performing a singular value decomposition and singular value filtering on data of MRI images, acquired at different echo times subsequent to an excitation pulse applied to a sample, to combine information of the MRI images into a final data set with reduced noise; and
   forming an image at any echo time with reduced noise based on the final data set.

20. The method as in claim 19, further comprising:
   dividing each of the MRI images into subsets of adjacent pixels; and
   performing the singular value decomposition and the singular value filtering on each subset separately.

21. A computer program product, encoded on a computer-readable medium, operable to cause data processing apparatus to perform operations comprising:
   performing a singular value decomposition and singular value filtering on data of magnetic resonance imaging (MRI) images, acquired at different echo times subsequent to an excitation pulse applied to a sample, to combine information of the MRI images into a final data set with reduced noise; and
   forming an image at any echo time with reduced noise based on the final data set.

22. The product as in claim 21, the operations comprising:
   dividing each of the MRI images into subsets of adjacent pixels; and
   performing the singular value decomposition and singular value filtering on each subset separately.

* * * * *

UNITED STATES PATENT AND TRADEMARK OFFICE
CERTIFICATE OF CORRECTION

PATENT NO.         : 7,795,869 B1
APPLICATION NO.    : 11/416797
DATED              : September 14, 2010
INVENTOR(S)        : Mark Bydder It is certified that error appears in the above-identified patent and that said Letters Patent is hereby corrected as shown below:

On the Title Page, in item (56), under "OTHER PUBLICATIONS", in Column 2, Lines 8-9, please delete "Imaging" and insert -- Imaging, --, therefor.

On the Title Page, in item (56), under "OTHER PUBLICATIONS", in Column 2, Line 19, please delete "Transations" and insert -- Transactions --, therefor.

On Page 2, in item (56), under "OTHER PUBLICATIONS", in Column 1, Line 3, please delete "Am" and insert -- Am, --, therefor.

On Page 2, in item (56), under "OTHER PUBLICATIONS", in Column 2, Line 13, please delete "Magneic" and insert -- Magnetic --, therefor.

In FIG. 6, Sheet 4 of 17, under "PROCESS 2", in Line 2, after "as" please delete "a".

In FIG. 6, Sheet 4 of 17, under "PROCESS 3", in Line 3, please delete "PROCRESS" and insert -- PROCESS --, therefor.

Figure 7:
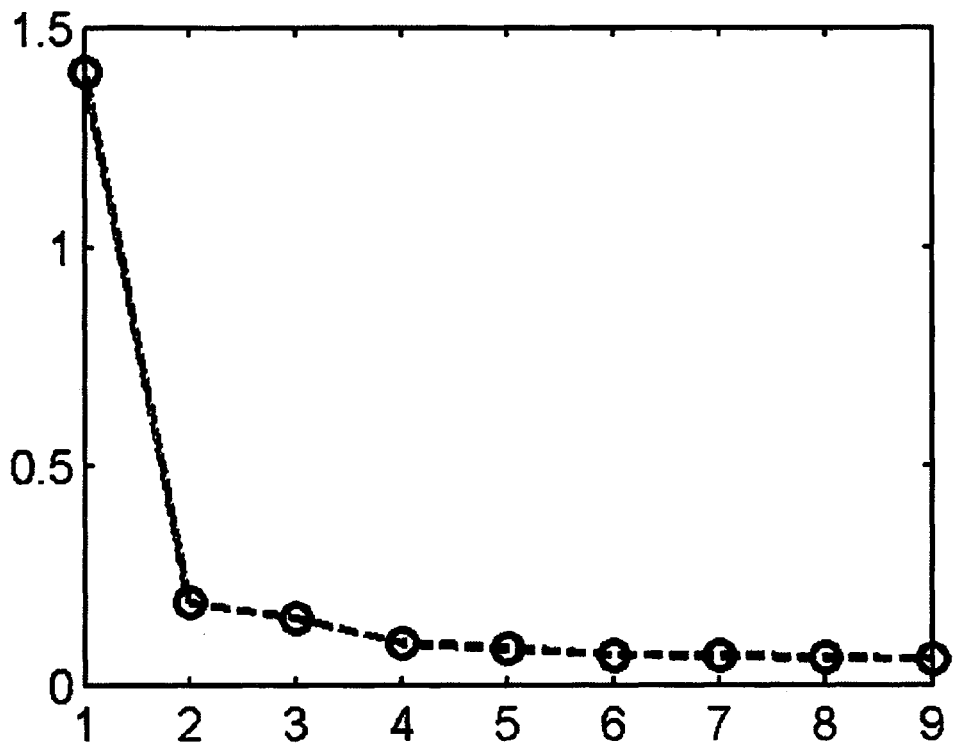
FIG. 7 shows a plot of singular values for MRI measurements on a liver using 9 echoes.
Figure 8A:
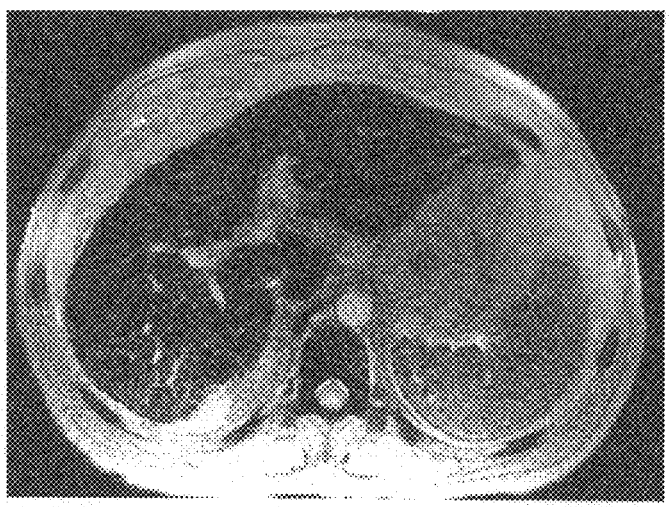
FIGS. 8A, 8B and 8C show an original MRI image of the liver with an TE of 13.2 ms, a processed image based on the original image, and the difference image between the original and the processed images, respectively.
Figure 8B:
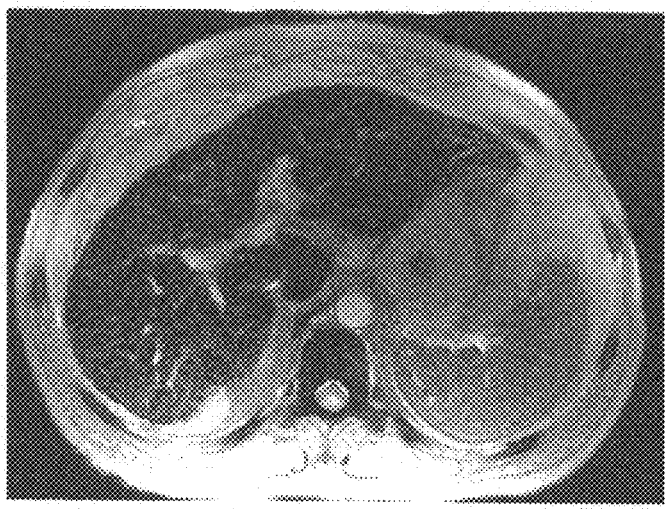
Figure 8C:
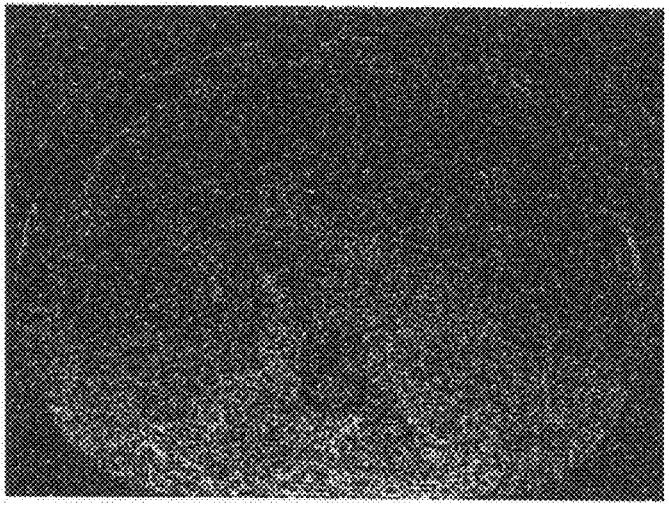

In FIG. 7, Sheet 5 of 17, under "Plot of Singular Values", Line 6, please delete "$3.3 \times 10^{-8}$" and insert -- $3.3 \times 10^{-8}$. --, therefor.

In FIG. 7, Sheet 5 of 17, under "Plot of Singular Values", Line 8, please delete "$3.6 \times 10^{-8}$" and insert -- $3.6 \times 10^{-8}$. --, therefor.

In Column 2, Line 4, please delete "presented" and insert -- presented. --, therefor.

In Column 2, Line 9, please delete "OF" and insert -- OF THE --, therefor.

Signed and Sealed this
Third Day of May, 2011

David J. Kappos
*Director of the United States Patent and Trademark Office*

CERTIFICATE OF CORRECTION (continued)
U.S. Pat. No. 7,795,869 B1

In Column 2, Line 35, please delete "CuSO4" and insert -- $CuSO_4$ --, therefor.

In Column 5, Line 42, in Equation [10], please delete "Aexp(-TE/T2)" and insert -- A exp(-TE/T2) --, therefor.

In Column 7, Line 46, please delete " $H$ " and insert -- $\overline{H}$ --, therefor.

In Column 7, Line 65, please delete "$\|H_k\text{-}H\|_F$," and insert -- $\|H_k\text{-}H\|_F$ --, therefor.

In Column 8, Lines 14, after "where" insert -- $\overline{\sigma}_j$ --.

In Column 12, Line 67, please delete "$\sigma_p$," and insert -- $\sigma_p$ --, therefor.